Figure 1:
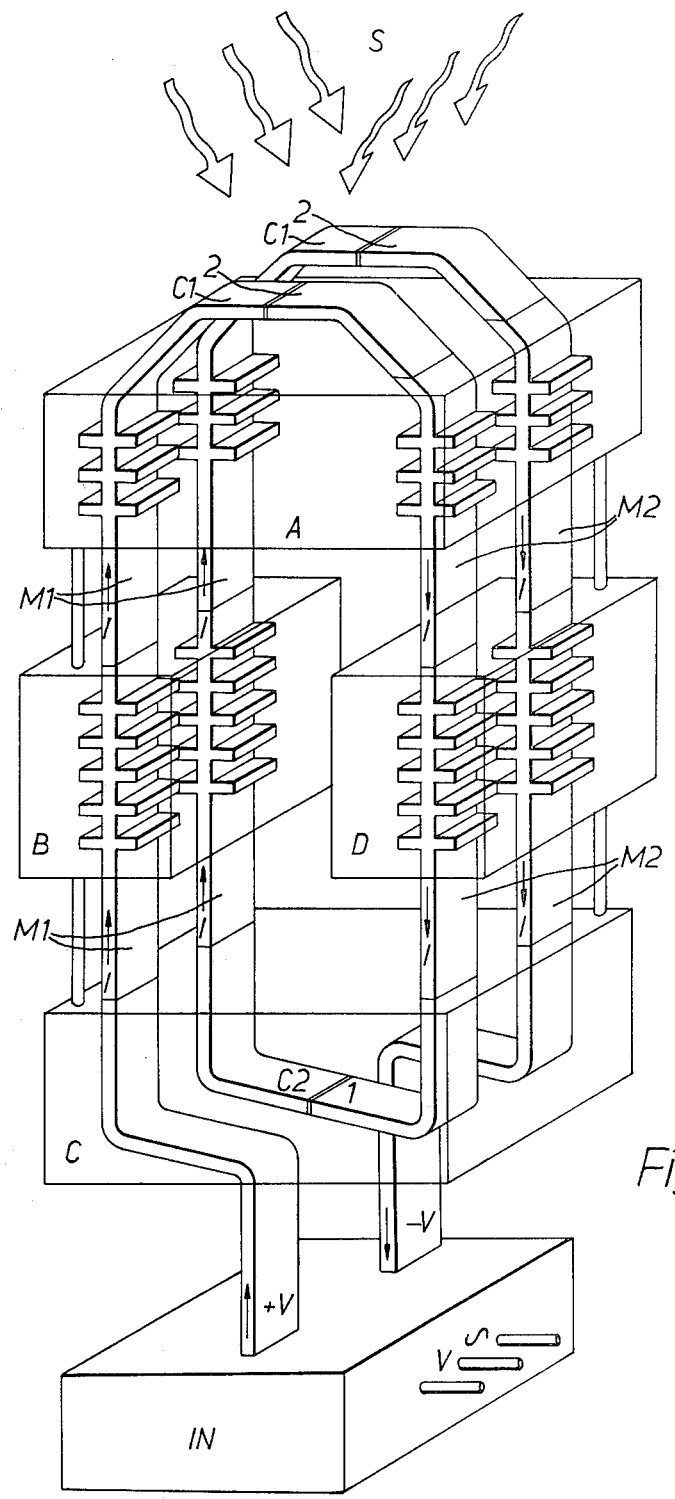

United States Patent [19]

Cannelli

[11] 4,276,440
[45] Jun. 30, 1981

[54] THERMOELECTRIC GENERATOR OPERATING WITH A COOLING DEVICE FOR CONVERTING SOLAR ENERGY INTO ELECTRIC ENERGY, AND SYSTEM FOR THE USE THEREOF

[76] Inventor: Pierino Cannelli, Via Fontanellato, 52, Rome, Italy

[21] Appl. No.: 27,908

[22] Filed: Apr. 6, 1979

[30] Foreign Application Priority Data

| Apr. 7, 1978 [IT] | Italy | 48789 A/78 |
| Jan. 11, 1979 [IT] | Italy | 47589 A/79 |
| Feb. 1, 1979 [IT] | Italy | 47851 A/79 |

[51] Int. Cl.³ ............................................. H01L 35/00
[52] U.S. Cl. ........................................ 136/206; 136/204; 136/208; 136/224
[58] Field of Search ................ 136/204, 206, 208, 224

[56] References Cited

U.S. PATENT DOCUMENTS

| 1,506,962 | 9/1924 | Andrews | 136/224 X |
| 1,526,641 | 2/1925 | Mulvany et al. | 136/224 X |
| 3,794,527 | 2/1974 | Kim | 136/208 |

Primary Examiner—Leland A. Sebastian
Attorney, Agent, or Firm—McAulay, Fields, Fisher, Goldstein & Nissen

[57] ABSTRACT

A generator of electric energy by the transformation of thermal, solar energy, or of heat of any source, consisting in one or more thermocouples combined with a cooling device, cooling down the weldings of the thermocouples on which heat is produced by the Peltier effect, also producing a very high thermal gradient. The cooling device exploits, for the functioning thereof, the phenomena which can be observed along the thermocouples. The system for the use of such a generator provides a particular disposition of the same in parabolic collectors, as to increase the sun ray concentration onto the weldings exposed to the heat and as to allow a decentralization in the electric energy supply by means of a plurality of generators consisting in only one thermocouple, said generators being interconnected.

12 Claims, 8 Drawing Figures

THERMOELECTRIC GENERATOR OPERATING WITH A COOLING DEVICE FOR CONVERTING SOLAR ENERGY INTO ELECTRIC ENERGY, AND SYSTEM FOR THE USE THEREOF

The present invention concerns a generator of electrical energy by the conversion of thermal, solar energy or of any other appropriate heat source, consisting in one or more thermocouples combined with an absorption cooling device acting on one of the weldings of the thermocouples, said cooling device being fed exploiting the same heat produced along the thermocouple(s) used.

It is well known how urgent the problem is to find new energy sources, and it is also well known how many experiments have been made, and the many researches that have been performed looking to exploit, most of all, the solar energy, to convert the same into electric energy.

The experiments performed until now have brought to two fundamental systems for converting solar energy into electric energy.

The first kind consists in a system which picks up the sun rays, stores the thermal energy thereof, transforming the sun rays into mechanical energy and, successively, into electric energy. This kind of system is adapted for the production of an energy of medium or great power, and requires a vast ground extension so as to provide for a pick up of a sufficient quantity of sun rays. Consequently, beyond the machinery used, said system requires much personnel for the conduction and the maintenance thereof. For its own nature, this kind of system can provide a satisfying efficiency only if it is of remarkable dimensions. Consequently, the necessity to feed many users by one and the same system, consists in the conventional loss of electric energy by transformation, transport and distribution.

The second kind of such systems, which have been until now the object of many experiments, converts the solar radiations directly into electric energy, exploiting the principle of the photovoltaic cells. This kind of system may be realized in smaller dimensions and does not request a high cost of personnel for the conduction thereof. Furthermore, for the dimensions thereof, it can also be employed for single, small users and therefore allow a decentralization in the electric energy supply. Nonetheless, the realization thereof is, even with the same power rate, more expensive than the first kind of system discussed hereinabove.

From that which is described above it appears evident that the experiments until now preformed to obtain electric energy which electric energy is, derived from solar energy, do not allow the practical actuation and the diffusion of the proposed systems as these are too expensive.

It is therefore a task of the present invention to propose a kind of system, the realization and conduction costs thereof providing for a widespread practical application, and which is simple in the realization and does not require any machinery of expensive maintenance. Therefore, the system does not involve personnel costs, and it is of such reduced dimensions that even assuring an optimal efficiency, the system permits a decentralization of the electric energy supply, thus furthermore assuring a higher efficiency for the single users, as the single user is no longer dependent on a single supply source.

Said task is solved realizing an electric energy generator consisting of one or more thermocouples made from metals with electrical and mechanical features which are the most appropriate for the purpose, combined with an adsorption cooling device, fed by the same heat supplied along the thermocouple(s) used, and said cooling device acting onto said welding of the thermocouple(s) on which, by the Peltier effect, heat is developed, as to reduce there the temperature of a maximum and therefore keep the thermal gradient between the hot and the cold weldings of the thermocouple(s) at a high level, thus obtaining a high value of generated e.m.f. and, consequently, a high value of the power.

Therefore, according to one of the main principles of the present invention, the heat developed on that welding of the thermocouple(s) used on which heat develops by the Peltier effect, is reduced of a maximum. In fact, as a consequence of the Peltier effect, on said weldings a heat is developed which, after some time, tends to reach the values of the heat supplied from the outside from the other welding of the thermocouple, so that the thermoelectric effect would be annulled. This inconvenience is completely eliminated by the combination of the thermocouples with the absorption cooling device, which has furthermore the possibility of highering the thermal gradient between the cool and the hot weldings of the thermocouples, increasing the efficiency of the electric energy generator, thus realized.

Another fundamental principle of the present invention is the one of feeding the absorption cooling device exploiting the same heat supplied along the thermocouples.

According to the present invention, a plurality of thermocouples are connected by welding in alternate succession of the component metals, as to assume a spiral-like disposition. In that spiral-like disposition, the welding zone of one couple of elements will always be opposite to the immediately successive welding, i.e. the weldings to be exposed to the heat are always aligned oppositely to the weldings to be cooled down. Furthermore, according to the present invention, the hot welding zones are blackened and placed into apposite, single containers out of insulating and refractory material, resistant to the smelting temperatures of the alloys of said weldings.

Always according to the present invention, the four principal elements forming the cooling device are applied to the thermocouples as follows: The first element, i.e. the boiler, is applied immediately below the welding zones to be exposed to the heat, as to be crossed by the elements of the one and the other metal of the thermocouples.

The second element, i.e. the condenser, is applied astride of the elements of one and the same metal of the thermocouples.

The third element, i.e. the absorber, is applied astride of the elements of the thermocouples consisting in the other metal.

The fourth element, i.e. the refrigerator, is applied opposite to the boiler, as to be crossed by the elements of the one and the other metal of the thermocouples and to contain all the welding zones which are to be cooled down.

Said four elements are evidently interconnected by means of a tubing which allows the flowing of the cooling fluid of the cycle.

According to the present invention, the elements of the thermocouples crossing the boiler, the condensor and the absorber of the cooling device are appropriately finned as to facilitate the heat exchange.

As has already been said, the cooling device, already known, applied to the thermocouples series, is operated, according to the present invention, by the same phenomena which can be observed along said thermocouples. In fact, the cooling fluid which is found inside the boiler, will be heated up to the boiling point by the heat immediately supplied, downstream of the welding zones exposed to the heat. The evaporated fluid passes, under pression, into the condensor in the form of gas, and in the condensor heat will be substracted from the gas by the Thompson effect, which, along that section of the thermocouples, can be observed in the form of heat absorbing. The gas thus cooled down enters the cooling device where it suddenly expands and thus produces the desired cold onto the welding zones contained therein. Then the gas goes up again towards the boiler crossing the absorber, wherein heat is now given in, exploiting the Thompson effect, which, along that section of the thermocouples, can be observed in the form of heat production.

Finally it is to be noted that the end of the first element of the forst thermocouple and the end of the last element of the last thermocouple are connected to a convertor, which transforms the direct current thus obtained into alternate current to be put on the distribution network.

The electric energy generator thus realized can be, in general, applied, according to the present invention, to different kinds of systems adapted to obtain the sun ray concentration along the welding zones of the thermocouples to be exposed to the heat. In the following two preferred embodiments of said systems will be described.

The first preferred embodiment according to the present invention provides the installation of a plurality of generators as above described disposed in dial to the axis of a paraboloid provided with a specular surface, already known. The generators are placed in such a way that the welding zones to be exposed to the heat of the sun rays will be found on the focus area of the paraboloid, while the welding zones which are to be cooled down are found beyond the convex area of the paraboloid, i.e. in a shadow area for the sun rays.

As to obtain a major concentration of the sun rays on the welding zones of the thermocouples to be exposed to the heat, above said zones a parabolic cap is provided, the concave area thereof being turned towards the concave area of said first paraboloid. The sun rays picked up by the first paraboloid are therefore further concentrated by said second parabolic cap, reflecting the same directly onto the whole welding zone to be heated up. Above said hot weldings, an already well known honeycomb structure is provided consisting in a plurality of small glass cylinders, as to avoid a heat dispersion due to re-irradiation or to connection. The single generators are connected between themselves, and the functioning thereof is completely the one above described. The end of the first element of the first thermocouple and the last element of the last thermocouple are, here too, appropriately connected to a convertor, transforming the direct current thus obtained into alternate current to be put on the distribution network. It will be obviously possible to realize a parallel and/or series connection of a plurality of similar installations, according to the needs of the users.

According to another embodiment of the present invention, which can be considered as a real variant of the same, single generators are used provided with only one thermocouple, to be considered as real modular unities of an assembly consisting in a plurality of such unities. Each one of said unities will work with a sun ray concentration, smaller that the one of the before mentioned embodiment and, therefore, at a lower temperature. Taking into consideration the simpler realization, this second embodiment will result to be cheaper in the realization thereof; the lower cost is also due to the possibility of making use of cheaper material for the realization, in consideration of the lower temperature at which it is working.

In this embodiment the thermocouple of each single modular is realized in such a way that the zone to be exposed to the heat consists in two this sheets of different materials, the one welded onto the other and wound as a spiral around the boiler of the cooling device, having the shape of a cylinder and appropriately placed along the focus area of a parabolic-cylindrical collector, and the welding zone to be cooled down consisting in two this sheets of the same materials of the first welding zone, welded one onto the other, and wound like a spiral around the refrigerator of the cooling device, the same being of cylindrical shape and placed opposite of the convex part of said cylindrical paraboloid, i.e. in the shadow area with respect of the sun rays, the condensor and the absorber being placed parallel between the boiler and the refrigerator and being interconnected and connected to the same by a feeding tubing in the cycle of the cold fluid.

The condensor and the absorber are, in this case, appropriately finned and the functioning thereof does not depend, as in the already described generator, from the heat given in or supplied, by the Thompson effect, from the relative sections of the thermoelectric couples, but from the simple heat exchange with the outside.

The two different metal sheets out of which the hot weldings consist, are appropriately blackened to favour the heat absorption. Furthermore, the same sheets, wound around the boiler of the cooling device are placed, together with said boiler, in a vacuum inside a quartz or pirex tube, as to avoid heat dispersion. The two different metal sheets forming the cold weldings wound around the refrigerator, are in turn contained, together with the refrigerator, within a tubolar element out of insulating material.

The connection between the hot and cold welding zone is realized by a crossing of one modular unity and the successive one, i.e. those thermocouple elements which are out of the same material are interconnected between hot weldings of one modular unity and cold weldings of the successive modular unity. This kind of connection causes the Thompson effects, which reveal in the form of giving in, respectively of absorbing of heat along the connecting elements of different material, achieve a thermal balance. For this purpose it is preferred that the connection conductors be concentrically placed one to the other, as well as distanced by insulating material.

Also in this case a parallel and/or series connection of a plurality of modular unities thus realized will be possible, according to the needs of the users.

The advantages reached by the present invention can be easily noted from what above described. The thermoelectric generator working with a cooling device, according to the present invention, to convert solar energy into electric energy, can in fact be realized in a much easier way and with much lower realization and conduction costs, the same being of 50% lower than the ones provided by the systems until now experimented. Said generator furthermore allows the decentralization of the electric energy supply, as it can be used also in reduced dimensions and therefore for a limited number of users, and thus still not increasing the cost or reducing the efficiency.

Figure 2:
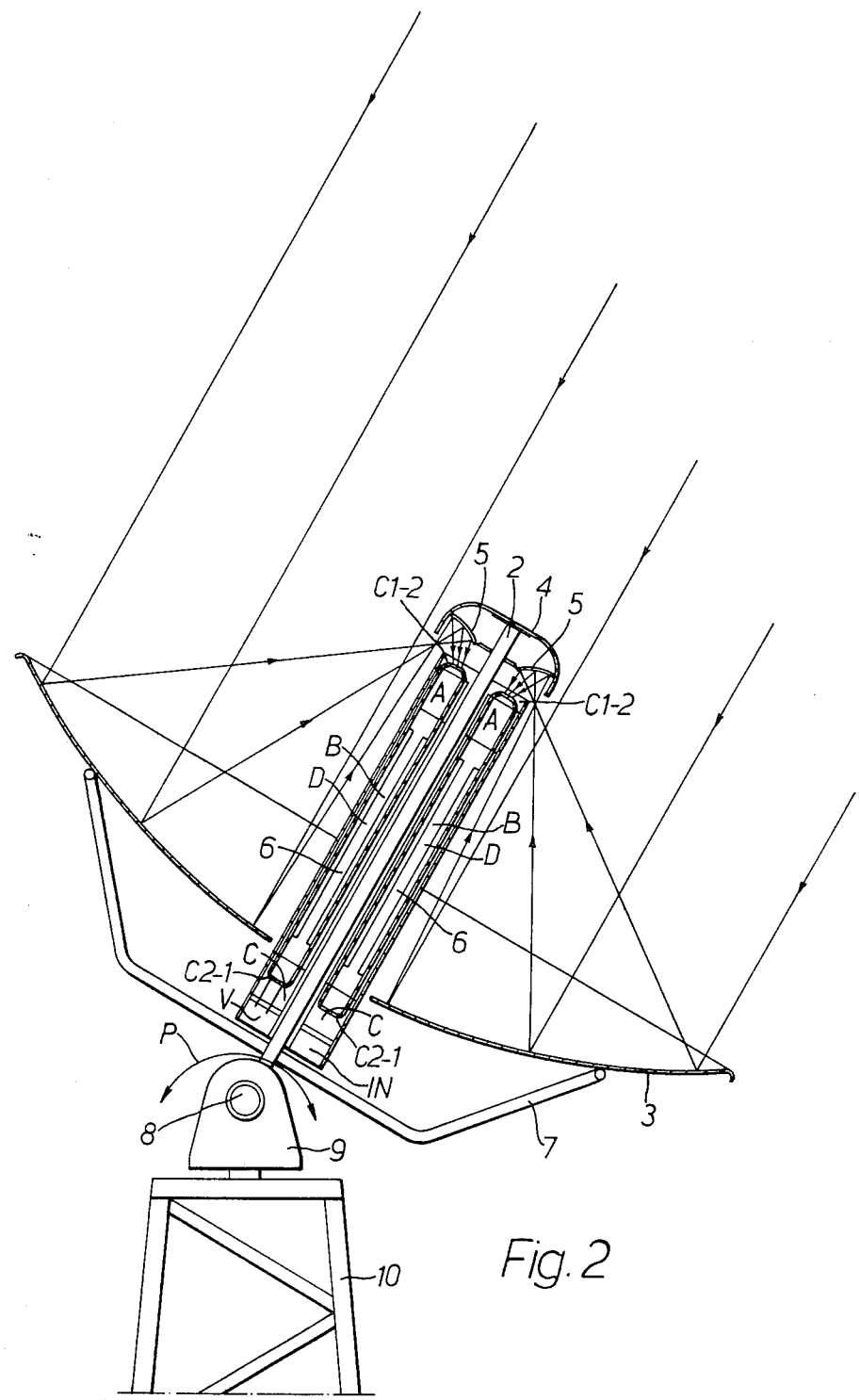
Figure 4:
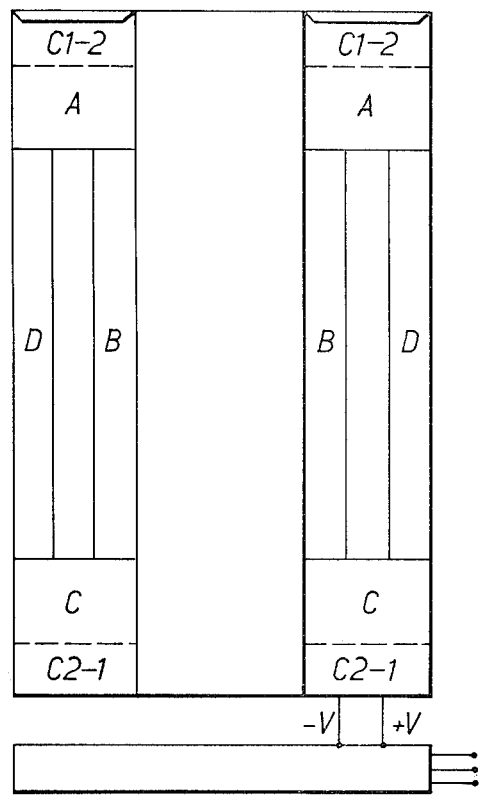
Figure 3:
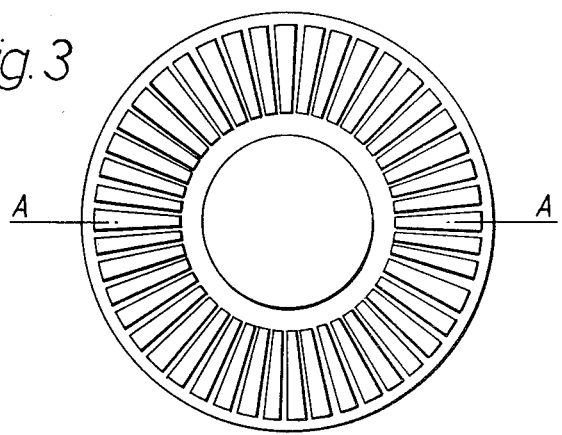
Figure 6:
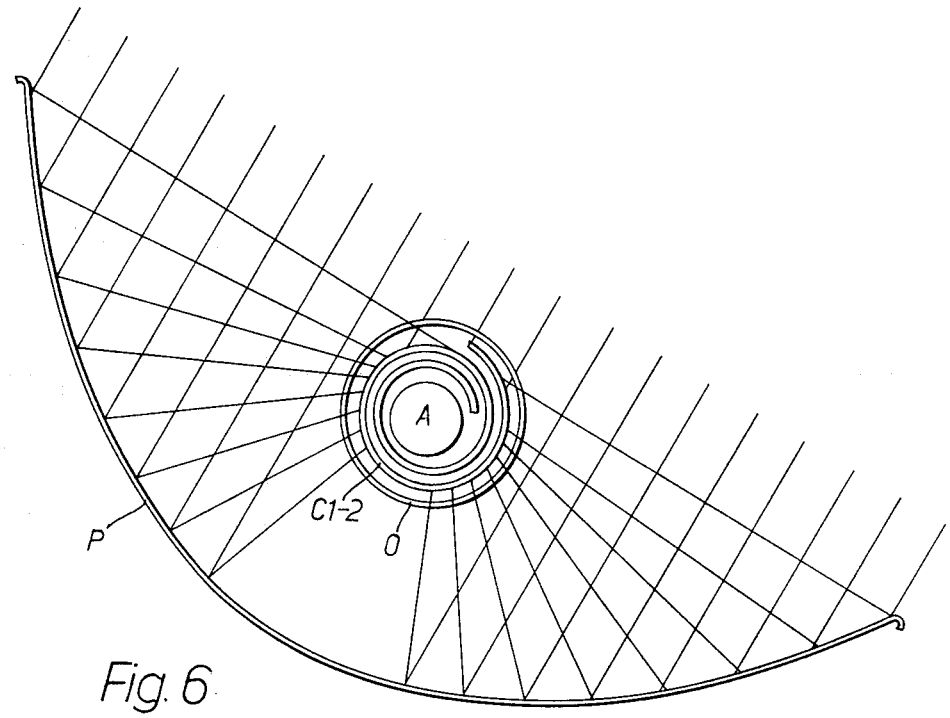
Figure 5:
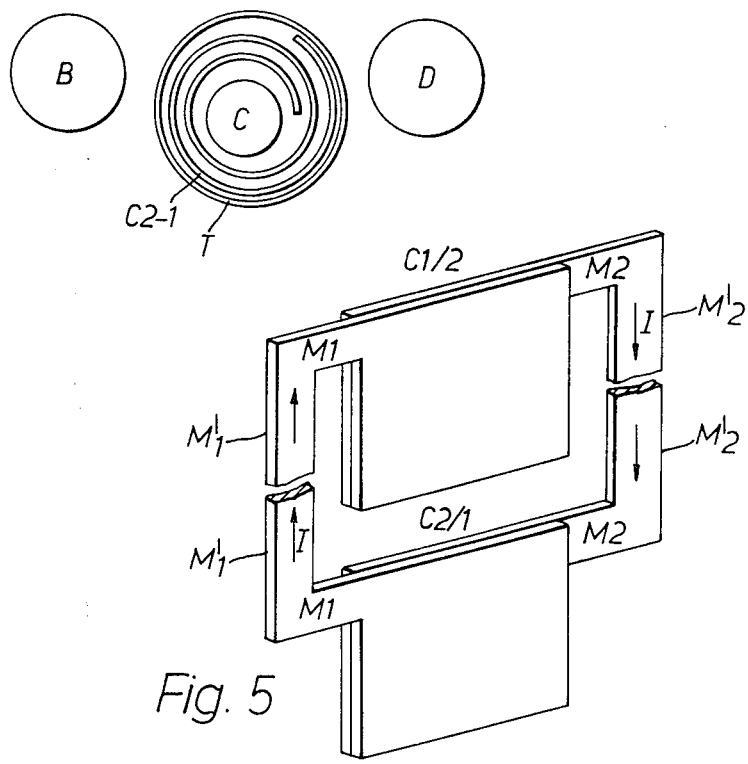
Figure 7:
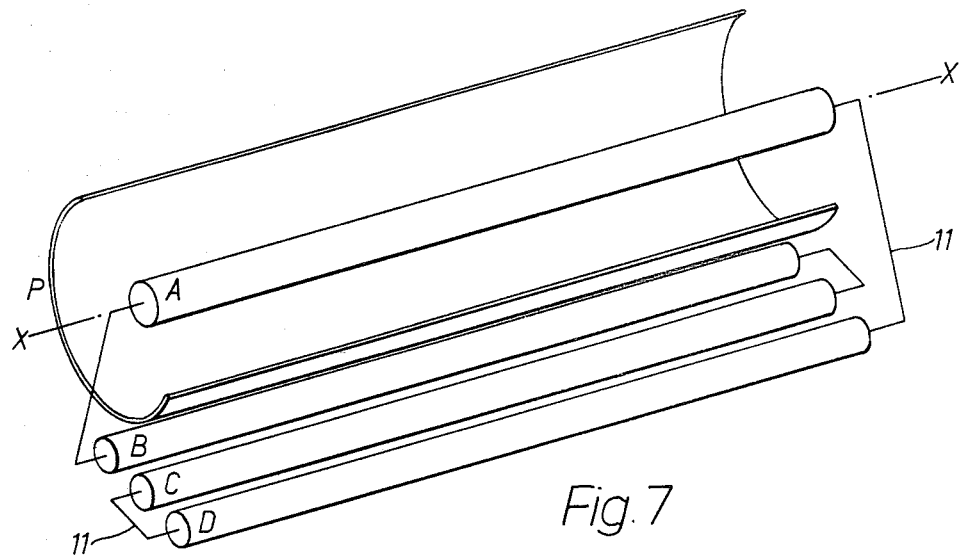
Figure 8:
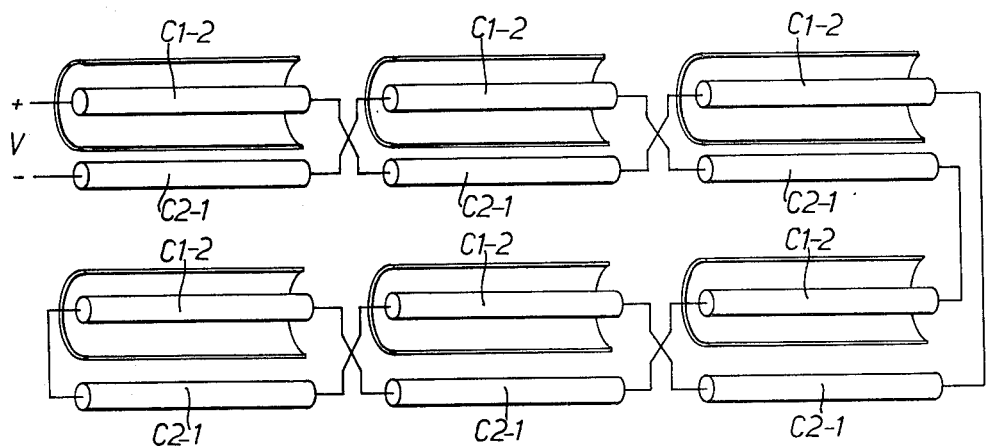

The present invention will be, hereinbelow, described more in detail referring to those embodiments described with an exemplifying and not limitative purpose, being understood that other forms, proportions and dispositions may be adopted, without therefore going out of the limits of the present invention. In the following description referring to the enclosed drawings, the figures show:

FIG. 1, an axonometric view of a thermoelectric generator working with a cooling device according to the present invention, said cooling device being applied to the thermocouples and connected to a current convertor;

FIG. 2, a section of an embodiment provided with a plurality of generators, placed in dial in a rotation paraboloid collector;

FIG. 3, a top view of the dial disposition of a plurality of generators according to the present invention according to FIG. 1;

FIG. 4, a transversal section according to line A—A of FIG. 3;

FIG. 5, the thermocouple of the generators, the metal sheets welded one onto the other before being wound around the boiler and the refrigerator of the cooling device;

FIG. 6, a schematic section view, in enlarged scale, of the disposition of the thermoelectric couple of FIG. 5 and to the cooling device of FIG. 7;

FIG. 7, a schematic, axonometric view of the cooling device applied to the variant in the form of modular unity;

FIG. 8, a schematic view of the connection of more modular unities, as for FIGS. 5 and 6.

In FIG. 1, M1 and M2 show the different metal elements of the thermocouples (of which in the figure only two are shown), placed close, like a spiral, the ends +V and −V being inserted in current convertor IN. Weldings C1-2 can be noted exposed to the heat, opposite if weldings C2-1, exposed to the cooling action of refrigerator C. A, B, C and D show the elements of the cooling device.

Boiler A contains cooling fluid which, under the action of the heat supplied by the thermocouple, warms up, evaporates and is led, in the gaseous status, to condensor B. In condensor B, from which heat is substracted by the Thompson effect which is produced along elements M1 of the thermocouples, the gas cools down and goes over to refrigerator C where, due to the sudden expansion thereof, it produces cold onto weldings C2-1. From refrigerator C the gas goes back again towards boiler A, passing through absorber D, where it absorbs the heat which now is given in by the Thompson effect produced along elements M2 of the thermocouples.

Thus a remarkable thermal gradient is established between weldings C1-2 heated up and weldings C2-1 cooled down and thus a considerable e.m.f. will be obtained at the ends +V and −V of the thermocouples. Convertor IN provides the transformation of d.c. into a.c., which will be then put on the distribution network, by means of an already known connection.

FIG. 2 shows a possibility of installation of the generator according to the present invention.

In this embodiment, a plurality of generators 6 according to the present invention are placed in dial according to the generating lines of a cylindrical envelope 1 placed along central axis 2 of a paraboloid 3, with a specular surface, already known. Envelope 1 projects of a certain section beyond the base of paraboloid 3, so that weldings C2-1 exposed to cooling down are found in a shadow area, while weldings C1-2 exposed to heat are found in the focus area of the paraboloid. At the end of central axis 2 of the paraboloid, which is found in the focus area, a cap 4 is applied supporting a parabolic cap 5 with a specular surface, placed with the concave part thereof turned towards the concave part of paraboloid 3. Said cap 5 has the purpose of further increasing the sun ray concentration, which from said cap are reflected on zones C1-2 of the thermocouples of generators 6 and, consequently, of increasing the heat on said zones.

Generators 6 are interconnected in parallel and/or in series, and the ends of the connection, shown in FIG. 2 with +V and −V, are also contained in envelope 1, as well as in convertor IN. Paraboloid 3 is supported by a support frame 7 applied to central axis 2, which has the fulcrum thereof at 8 onto a flask 9 so that it can be adjusted in height according to arrow P. Flask 9 is in turn pivotally placed onto a base 10.

Above disposition is shown more in detail in FIGS. 3 and 4.

FIG. 6 shows a different embodiment of the generator according to the present invention. In this embodiment, each generator consists in a single thermocouple and therefore forms a modular unity to be connected to others of the same kind as to form a system of any dimension. It has already been explained that this embodiment is cheaper than the first, due to the simplicity of the realization.

FIG. 5 clearly shows the two metal sheet couples M1, M2 of different material, welded one onto the other as to form the hot welding zone C1-2 and the cold welding zone C2-1, before being wound respectively around boiler A and refrigerator C.

M'1 and M'2 respectively show connection arms of the metal sheet couples. I shows the current direction.

FIG. 6 shows, in section, how one of the metal sheet couples is wound like a spiral around boiler A of the cooling device and how both are placed in a tube Q out of quartz or pirex, under vacuum, as to avoid a heat dispersion. The tube is placed along the focus area of a parabolic cylindrical collector P which, in an already well known way, can be adjusted with respect to the sun. FIG. 6 still shows how the other couple of metal sheets is wound around refrigerator C of the cooling device and how both are placed within a tube T out of insulating material. In FIG. 6 the positions of condensor B and of absorber C of the cooling device are also schematically sketched in, the condensor and the absorber being connected, by means of a tubing, here not shown, to boiler A and refrigerator C.

FIG. 7 is an axonometric, schematic view of the position of boiler A in the focus area of parabolic cylindrical collector P, as well as the position of elements B, C, D of the cooling device, interconnected, of tubing 11.

Finally, FIG. 8 schematically shows a connection in series of a plurality of modular unities, i.e. of a plurality of generators realized according to a variant of the present invention. From that figure it can be seen how the connections of the metallic sheet couples relative to hot welding zone C1-2 and to cold welding zone C2-1 of a modular unity are crossed with the corresponding couples of the successive modular unity as to obtain a reciprocal balance of the Thompson effects which can be observed as giving in and respectively absorbing heat along connection arms M'$_1$ and M'$_2$ of different materials.

I claim:

1. A generator of electric energy for the conversion from solar, thermal energy, or from any other appropriate heat source, consisting in one or more thermocouples combined with an absorption cooling device acting on one of the weldings of the thermocouple(s), wherein the thermocouple(s) are out of materials (M1, M2) provided with the most appropriate electric anc mechanic features, and wherein the absorption cooling device (A, B, C, D) is fed by the same heat supplied along the thermocouple(s) used, and said cooling system acting on that welding of the thermocouple(s) on which, by the Peltier effect, heat is developed, with the purpose of reducing of a maximum the temperature and therefore to maintain at a high level the thermal gradient between hot weldings (C1-2) and cold weldings (C2-1) of the thermocouple(s), thus obtaining a high e.m.f. value and consequently, a high power value.

2. A generator of electric energy according to claim 1, wherein the Thompson effect is exploited for the feeding of condensor (B) and an absorber (D) of the cooling device when said Thompson effect can be noted as an absorption, respectively as a giving in of heat along the arms out of different metals of the thermocouples.

3. A generator of electric energy according to claim 1, wherein the thermocouples are connected by welding in an alternate succession of the component metals (M1, M2) as to assume a disposition like a spiral, so that all the weldings (C1-2) to be exposed to the heat are always aligned and opposite to weldings (C2-1) to be cooled down.

4. A generator of electric energy according to claim 1, wherein end (+V) of the first element of the first thermocouple and end (−V) of the last element of the last thermocouple are connected to a conventor (IN) which transforms the direct current produced by the generator into alternate current to be put on the distribution network.

5. A generator of electric energy according to claim 1, wherein the hot welding zones are placed in appropriate, single containers out of insulating and refractory material, resistant to the smelting temperature of the alloy of the weldings.

6. A system for the use of a generator of electric energy according to claim 1, wherein a plurality of generators (6) are placed in dial according to the longitudinal central axis (2) of a rotation paraboloid collector (3) provided with a specular surface, so that welding zones (C1-2) to be exposed to the heat are found in the focus area of the paraboloid, while welding zones (C2-1) to be cooled down are found in a shadow area, beyond the convex area of paraboloid (3), and wherein paraboloid (3) can be inclined with respect to the sun, and rotated onto itself.

7. A system according to claim 6, wherein above welding zones (C1-2) to be exposed to the heat a parabolic cap (5), the concave part thereof being turned towards the concave part of paraboloid (3), is provided, as to obtain a further sun ray concentration onto weldings (C1-2) and, consequently, a major efficiency of the system.

8. A system according to claim 7, wherein on hot weldings (C1-2) a honeycomb structure is provided consisting in small glass cylinders with the purpose of avoiding any heat dispersion by re-irradiation and by convection.

9. A system for the use of a generator of electric energy according to claim 1, wherein the generator consists in only one thermocouple and the welding zone (C1-2) to be heated up consists in two thin sheets (M1, M2) out of different materials welded the one onto the other, and wound like a spiral around boiler (A) of the cooling device, said boiler having the form of a cylinder and being appropriately placed along the focus area of a rotation paraboloid collector (P), while welding zone (C2-1) to be cooled down, also consisting in two thin sheets of the same materials of the first welding zone, welded the one onto the other, is wound like a spiral around refrigerator (C) of the cooling device, also in the form of a cylinder, being placed opposite to the convex part of said cylindric-parabolic collector (P), i.e. in the shadow area of the sun rays, a condensor (B) and an absorber (D) of the cooling device being placed in the same shadow area, parallel between boiler (A) and refrigerator (C), being interconnected and connected thereto by a feeding tubing in the cycle of the cooling fluid.

10. A system according to claim 9, wherein the two different metal sheets forming hot weldings (C1-2) are appropriately blackened to favour the heat absorption of the same, and wherein the same, together with boiler (A), are placed under vacuum in a tube (Q) out of quartz or pirex, to avoid heat dispersion, and wherein the two sheets out of different metals forming the cold weldings, wound around refrigerator (C), are in turn placed, together with the refrigerator, in a tube (T) out of a material insulating towards the outside.

11. A system according to claim 9 or 10, wherein the connection of the metal sheet couples corresponding to hot welding zone (C1-2) of one modular unity takes place crossed with the corresponding couple of the successive modular unity as to obtain a reciprocal thermal balance of the Thompson effects, which can be observed in the form of giving in, respectively of absorption of heat along connection arms (M1, M2) out of different materials.

12. A system according to claim 1, including
a honey-comb structure comprising small glass cylinders provided on said hot weldings for avoiding any heat dispersion by re-irradiation and by convection.

* * * * *